United States Patent
Nishii

(10) Patent No.: US 9,966,447 B2
(45) Date of Patent: May 8, 2018

(54) METHOD OF MANUFACTURING SEMICONDUCTOR DEVICE BY PLASMA TREATMENT AND HEAT TREATMENT, AND SEMICONDUCTOR DEVICE

(71) Applicant: Toyoda Gosei Co., Ltd., Kiyosu-shi (JP)

(72) Inventor: Junya Nishii, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days. days.

(21) Appl. No.: 15/456,328

(22) Filed: Mar. 10, 2017

(65) Prior Publication Data
US 2017/0278935 A1 Sep. 28, 2017

(30) Foreign Application Priority Data
Mar. 24, 2016 (JP) ................................. 2016-059901

(51) Int. Cl.
*H01L 29/423* (2006.01)
*H01L 29/78* (2006.01)
*H01L 29/51* (2006.01)
*H01L 21/28* (2006.01)
*H01L 21/02* (2006.01)
(Continued)

(52) U.S. Cl.
CPC ...... *H01L 29/4236* (2013.01); *H01L 21/0228* (2013.01); *H01L 21/0234* (2013.01); *H01L 21/28185* (2013.01); *H01L 21/28211* (2013.01); *H01L 29/518* (2013.01); *H01L 29/66666* (2013.01); *H01L 29/66734* (2013.01); *H01L 29/7813* (2013.01); *H01L 29/7827* (2013.01); *H01L 29/8122* (2013.01)

(58) Field of Classification Search
CPC ............. H01L 29/4236; H01L 21/0228; H01L 21/0234; H01L 21/28185; H01L 21/28211; H01L 29/518; H01L 29/66666; H01L 29/7827; H01L 21/0214; H01L 21/02172; H01L 21/02252; H01L 21/0226
USPC ............... 257/284, 330, 332, 374, 510, 520; 438/248, 259, 270, 391, 485
See application file for complete search history.

(56) References Cited

U.S. PATENT DOCUMENTS

2002/0063295 A1 * 5/2002 Ando .............. H01L 21/823857
257/369
2006/0102972 A1 * 5/2006 Bhattacharyya H01L 31/022425
257/432
(Continued)

FOREIGN PATENT DOCUMENTS

JP 2004-288884 A 10/2004

*Primary Examiner* — Shahed Ahmed
(74) *Attorney, Agent, or Firm* — McGinn IP Law Group, PLLC.

(57) ABSTRACT

A technique of manufacturing a semiconductor device of stable operation is provided. There is provided a method of manufacturing a semiconductor device comprising a first process of forming an insulating film from a nitrogen-containing organic metal used as raw material, on a semiconductor layer by atomic layer deposition; a second process of processing the insulating film by oxygen plasma treatment in an atmosphere including at least one of oxygen and ozone; and a third process of processing the insulating film by heat treatment in a nitrogen-containing atmosphere, after the second process.

20 Claims, 8 Drawing Sheets

(51) Int. Cl.
*H01L 29/66* (2006.01)
*H01L 29/812* (2006.01)

(56) References Cited

U.S. PATENT DOCUMENTS

2007/0077776 A1 4/2007 Koji et al.
2017/0148628 A1* 5/2017 Swaminathan ... H01L 21/02123

* cited by examiner

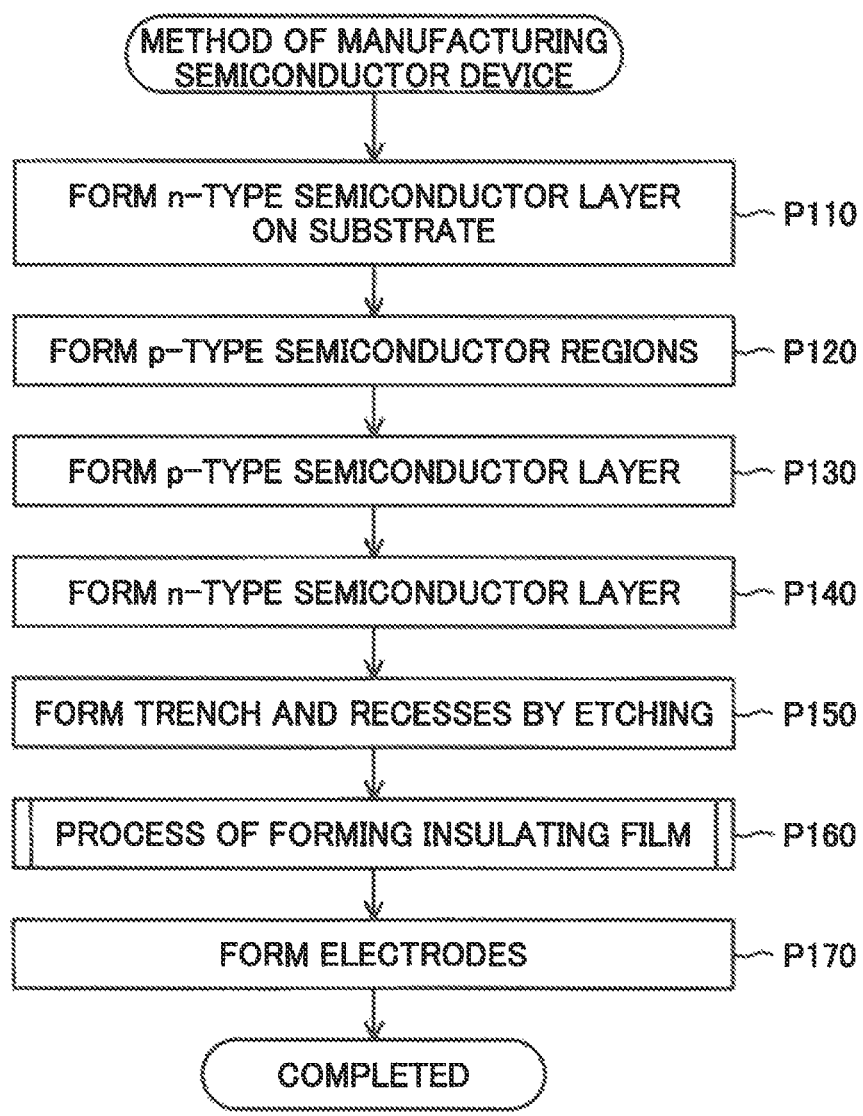

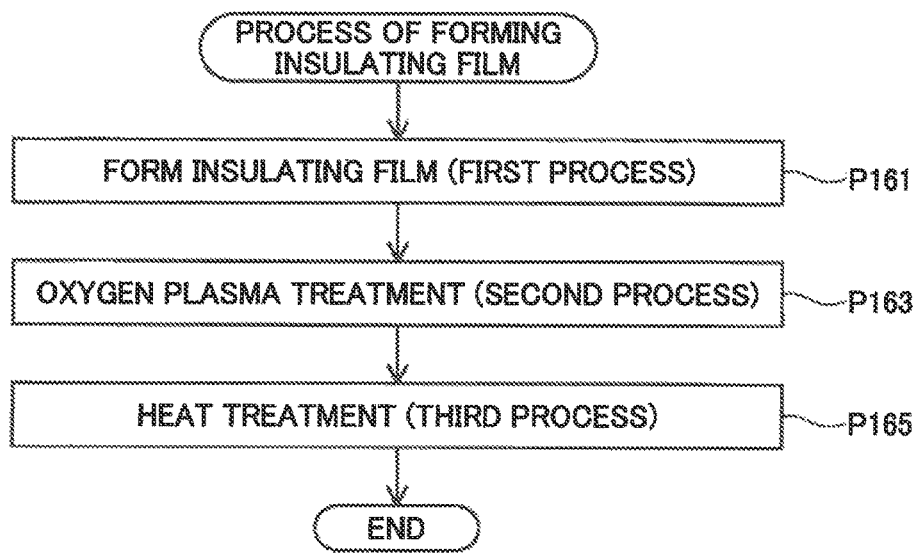
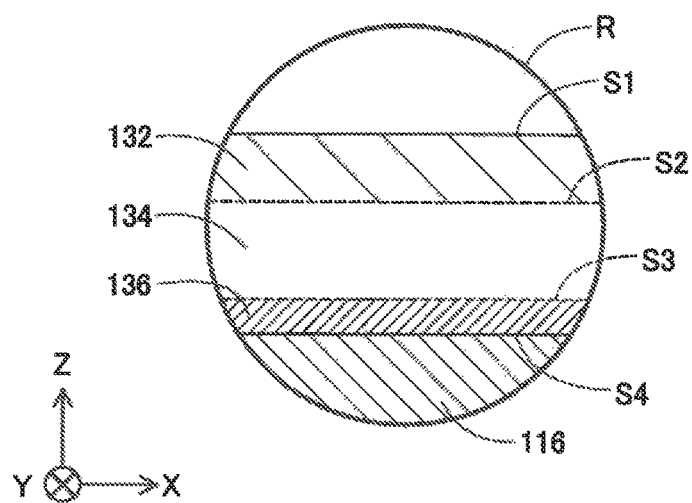

METHOD OF MANUFACTURING SEMICONDUCTOR DEVICE BY PLASMA TREATMENT AND HEAT TREATMENT, AND SEMICONDUCTOR DEVICE

CROSS-REFERENCE TO RELATED APPLICATION

The present application claims priority from Japanese patent applications No. 2016-059901 filed on Mar. 24, 2016, the content of which is hereby incorporated by reference into this application.

BACKGROUND

Field

The disclosure relates to a method of manufacturing a semiconductor device, and a semiconductor device.

Related Art

A semiconductor device including an insulating film has been known conventionally. For example, atomic layer deposition (ALD) has also been known as a technique of forming an insulating film. As is known in the art, however, impurities derived from a film-forming raw material are included in an insulating film formed by ALD and increase a CV hysteresis of the insulating film (as described in, for example, JP 2004-288884A). JP 2004-288884A accordingly focuses attention on carbon (C) included in the film-forming raw material and discloses a method that reduce the amount of carbon (C).

The method described in JP 2004-288884A is, however, insufficient as the method of reducing the CV hysteresis of the insulating film. There is accordingly a need for a technique that further reduces the CV hysteresis of the insulating film and manufactures a semiconductor device of stable operation.

SUMMARY

In order to solve at least part of the problems described above, the disclosure may be implemented by aspects described below.

(1) According to one aspect of the invention, there is provided a method of manufacturing a semiconductor device. The method of manufacturing the semiconductor device comprises: a first process of forming an insulating film from a nitrogen-containing organic metal used as raw material, on a semiconductor layer by atomic layer deposition; a second process of processing the insulating film by oxygen plasma treatment in an atmosphere including at least one of oxygen and ozone; and a third process of processing the insulating film by heat treatment in a nitrogen-containing atmosphere, after the second process. The method of manufacturing the semiconductor device of this aspect reduces the CV hysteresis of the insulating film and thereby enables a semiconductor device of stable operation to be manufactured.

(2) According to one embodiment of the method of manufacturing the semiconductor device, a remote plasma may be used for the oxygen plasma treatment. The method of manufacturing the semiconductor device of this aspect reduces the potential damage of the insulating film by the plasma in the oxygen plasma treatment.

(3) According to one embodiment of the method of manufacturing the semiconductor device, an electron cyclotron resonance plasma may be used for the oxygen plasma treatment. The method of manufacturing the semiconductor device of this aspect further reduces the potential damage of the insulating film by the plasma in the oxygen plasma treatment.

(4) According to another aspect of the invention, there is provided a semiconductor device. The semiconductor device comprises a semiconductor layer and an insulating film that is arranged to be adjacent to and in contact with the semiconductor layer, wherein an average nitrogen concentration in a region of the insulating film to a depth of 30 nm from a face of the insulating film that is not adjacent to and not in contact with the semiconductor layer is lower than $3.0 \times 10^{18}$ cm$^{-3}$, and the average nitrogen concentration in a region of the insulating film from a virtual plane that is at a depth of 30 nm from the face of the insulating film that is not adjacent to and not in contact with the semiconductor layer to a virtual plane that is at a depth of 20 nm to a face of the insulating film that is adjacent to and in contact with the semiconductor layer is not lower than $3.0 \times 10^{18}$ cm$^{-3}$ and is lower than $1.0 \times 10^{19}$ cm$^{-3}$. The semiconductor device of this aspect has the reduced CV hysteresis of the insulating film and thereby provides the high operation stability.

(5) According to one embodiment of the semiconductor device, an average hydrogen concentration in a region of the insulating film to a depth of 20 nm from the face of the insulating film that is not adjacent to and not in contact with the semiconductor layer may be not lower than $1.0 \times 10^{20}$ cm$^{-3}$ and is lower than $10^{21}$ cm$^{-3}$. The semiconductor device of this aspect has the reduced CV hysteresis of the insulating film and thereby provides the high operation stability.

(6) According to one embodiment, the semiconductor device may further comprise an electrode formed from a metal, on the insulating film. The semiconductor device of this aspect has the reduced CV hysteresis of the insulating film and thereby provides the high operation stability.

(7) According to one embodiment of the semiconductor device, the semiconductor layer may include a groove, and the insulating film may be formed inside of the groove. The semiconductor device of this aspect has the reduced CV hysteresis of the insulating film and thereby provides the high operation stability.

(8) According to one embodiment of the semiconductor device, the semiconductor device may be a vertical trench MOSFET. The semiconductor device of this aspect has the reduced CV hysteresis of the insulating film and thereby provides the high operation stability.

The disclosure may be implemented by any of various aspects other than the method of manufacturing the semiconductor device described above and the semiconductor device described above, for example, an apparatus of manufacturing a semiconductor device according to the manufacturing method described above.

The method of manufacturing the semiconductor device according to any one of the aspects described above reduces the CV hysteresis of the insulating film and thereby enables a semiconductor device of stable operation to be manufactured. The semiconductor device according to any one of the aspects described above has the reduced CV hysteresis of the insulating film and thereby provides the high operation stability.

BRIEF DESCRIPTION OF DRAWINGS

FIG. 2 is a process chart showing a method of manufacturing the semiconductor device according to the first embodiment;

FIG. 3 is a process chart showing the details of a process of forming an insulating film according to the first embodiment;

FIG. 4 is a sectional view schematically illustrating concentration distributions in the insulating film after the process of forming the insulating film;

DESCRIPTION OF EMBODIMENTS

A. First Embodiment

A-1. Structure of Semiconductor Device

Figure 1:
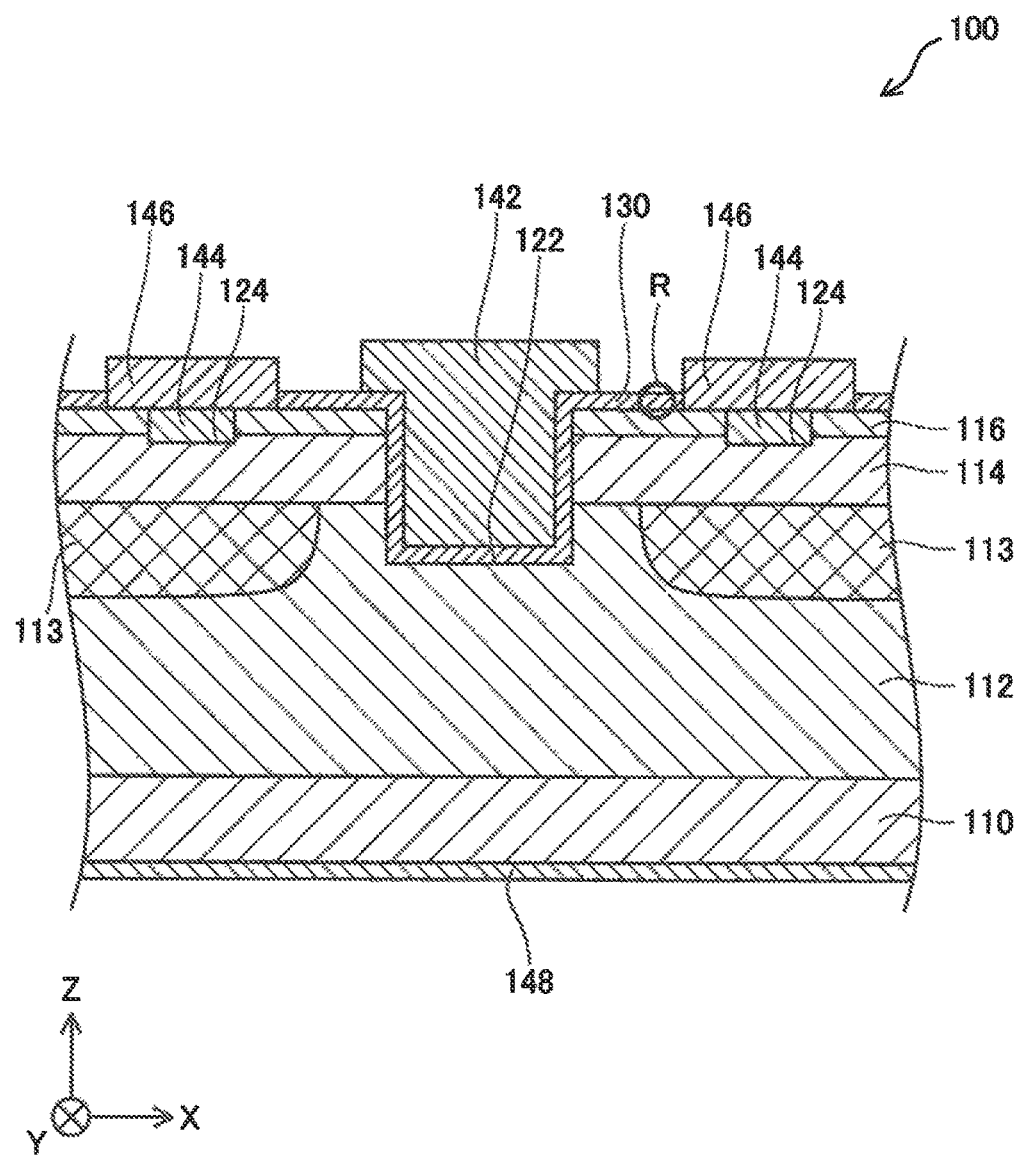
FIG. 1 is a sectional view schematically illustrating the structure of a semiconductor device according to a first embodiment.

FIG. 1 is a sectional view schematically illustrating the structure of a semiconductor device 100 according to a first embodiment. XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface. The XYZ axes illustrated in other drawings correspond to the XYZ axes of FIG. 1.

According to this embodiment, the semiconductor device 100 is a GaN-based semiconductor device formed by using gallium nitride (GaN). According to this embodiment, the semiconductor device 100 is a vertical trench MOSFET (metal-oxide-semiconductor field-effect transistor). According to this embodiment, the semiconductor device 100 is used for power control and is also called power device.

The semiconductor device 100 includes a substrate 110, an n-type semiconductor layer 112, p-type semiconductor regions 113, a p-type semiconductor layer 114 and an n-type semiconductor layer 116. The semiconductor device 100 has a trench 122 and recesses 124 as structures formed in these semiconductor layers. The semiconductor device 100 further includes an insulating film 130, a gate electrode 142, body electrodes 144, source electrodes 146 and a drain electrode 148.

The substrate 110 of the semiconductor device 100 is a plate-like semiconductor extended along the X axis and the Y axis. According to this embodiment, the substrate 110 is mainly made of gallium nitride (GaN). In the description hereof, the expression of "mainly made of A (for example, gallium nitride (GaN))" means containing A (for example, gallium nitride (GaN)) at 90% or higher molar fraction.

According to this embodiment, the substrate 110 is an n-type semiconductor containing silicon (Si) as a donor element. According to this embodiment, the average concentration of silicon (Si) contained in the substrate 110 is not lower than $1\times10^{18}$ cm$^{-3}$. The thickness (length in the Z-axis direction) of the substrate 110 is not less than 100 μm (micrometer) and may be, for example, 300 m according to this embodiment.

The n-type semiconductor layer 112 of the semiconductor device 100 is a semiconductor having n-type characteristics. According to this embodiment, the n-type semiconductor layer 112 is located on a +Z-axis direction side of the substrate 110 and is extended along the X axis and the Y axis. According to this embodiment, the n-type semiconductor layer 112 is mainly made of gallium nitride (GaN). According to this embodiment, the n-type semiconductor layer 112 contains silicon (Si) as a donor element (n-type impurity). According to this embodiment, the average concentration of silicon (Si) contained in the n-type semiconductor layer 112 is not higher than about $1\times10^{17}$ cm$^{-3}$ and may be, for example, $1\times10^{16}$ cm$^{-3}$. According to this embodiment, the thickness (length in the Z-axis direction) of the n-type semiconductor layer 112 may be, for example, 10 μm.

The p-type semiconductor regions 113 of the semiconductor device 100 are areas formed by ion implantation into part of the n-type semiconductor layer 112. The semiconductor of the p-type semiconductor regions 113 has p-type characteristics. According to this embodiment, the p-type semiconductor regions 113 are formed at positions away from the trench 122 and are arranged adjacent to the n-type semiconductor layer 112 and the p-type semiconductor layer 114. According to this embodiment, the p-type semiconductor regions 113 are mainly made of gallium nitride (GaN), like the n-type semiconductor layer 112. According to this embodiment, the p-type semiconductor regions 113 contain magnesium (Mg) as an acceptor element (p-type impurity). In the p-type semiconductor regions 113, the concentration of the p-type impurity is higher than the concentration of the n-type impurity. According to this embodiment, in the p-type semiconductor regions 113, the concentration of the p-type impurity is at least 100 times higher than the concentration of the n-type impurity. According to this embodiment, the average concentration of magnesium (Mg) contained in the p-type semiconductor regions 113 is not lower than $1\times10^{18}$ cm$^{-3}$.

The p-type semiconductor layer 114 of the semiconductor device 100 is a semiconductor having p-type characteristics. According to this embodiment, the p-type semiconductor layer 114 is located on a +Z-axis direction side of the n-type semiconductor layer 112 and the p-type semiconductor regions 113 and is extended along the X axis and the Y axis. According to this embodiment, the p-type semiconductor layer 114 is mainly made of gallium nitride (GaN). According to this embodiment, the p-type semiconductor layer 114 contains magnesium (Mg) as an acceptor element. According to this embodiment, the average concentration of magnesium (Mg) contained in the p-type semiconductor layer 114 is not higher than about $4\times10^{18}$ cm$^{-3}$. According to this embodiment, the thickness (length in the Z-axis direction) of the p-type semiconductor layer 114 may be, for example, about 1.0 μm.

The n-type semiconductor layer 116 of the semiconductor device 100 is a semiconductor having n-type characteristics. According to this embodiment, the n-type semiconductor layer 116 is located on a +Z-axis direction side of the p-type semiconductor layer 114 and is extended along the X axis and the Y axis. According to this embodiment, the n-type semiconductor layer 116 is mainly made of gallium nitride (GaN). According to this embodiment, the n-type semiconductor layer 116 contains silicon (Si) as a donor element. According to this embodiment, the average concentration of silicon (Si) contained in the n-type semiconductor layer 116 is not lower than $1 \times 10^{18}$ cm$^{-3}$ and may be, for example, about $3 \times 10^{18}$ cm$^{-3}$. According to this embodiment, the thickness (length in the Z-axis direction) of the n-type semiconductor layer 116 is not greater than 0.4 μm and may be, for example, about 0.2 μm.

The trench 122 of the semiconductor device 100 is a groove that is formed from a +Z-axis direction side face of the n-type semiconductor layer 116 to pass through the n-type semiconductor layer 116 and the p-type semiconductor layer 114 and is recessed into the n-type semiconductor layer 112. According to this embodiment, the trench 122 is a structure formed by dry etching of the n-type semiconductor layer 116, the p-type semiconductor layer 114 and the n-type semiconductor layer 112.

The recesses 124 of the semiconductor device 100 are concaves that are formed from the +Z-axis direction side face of the n-type semiconductor layer 116 to pass through the n-type semiconductor layer 116 and are recessed into the p-type semiconductor layer 114. According to this embodiment, the recesses 124 are structures formed by dry etching of the n-type semiconductor layer 116 and the p-type semiconductor layer 114.

The insulating film 130 of the semiconductor device 100 is a film that is formed inside of the trench 122 and has electrical insulation property. According to this embodiment, the insulating film 130 is formed from inside of the trench 122 over to part of the +Z-axis direction side face of the n-type semiconductor layer 116. According to this embodiment, the insulating film 130 is arranged adjacent to the semiconductor layers 112, 114 and 116 and is mainly made of silicon dioxide (SiO$_2$).

The gate electrode 142 of the semiconductor device 100 is an electrode formed inside of the trench 122 via the insulating film 130. According to this embodiment, the gate electrode 142 is formed from inside of the trench 122 over to part of a +Z-axis direction side face of the insulating film 130 that is outside of the trench 122. The gate electrode 142 is made of a metal and is mainly made of aluminum (Al) according to this embodiment. When a voltage is applied to the gate electrode 142, an inversion layer is formed in the p-type semiconductor layer 114. This inversion layer serves as a channel, so that a conductive path is formed between the source electrode 146 and the drain electrode 148. In other words, when a voltage is applied to the gate electrode 142, electric current flows in a vertical direction (Z-axis direction) of the substrate 110.

The body electrodes 144 of the semiconductor device 100 are electrodes that are formed in the recesses 124 and are arranged to be in ohmic contact with the p-type semiconductor layer 114. According to this embodiment, the body electrodes 144 are electrodes formed by heat treatment of a layer that is mainly made of palladium (Pd).

The source electrodes 146 of the semiconductor device 100 are electrodes that are arranged to be in ohmic contact with the n-type semiconductor layer 116. According to this embodiment, the source electrode 146 is formed on the body electrode 144 over to part of the +Z-axis direction side face of the n-type semiconductor layer 116. According to another embodiment, the source electrode 146 may be formed in a site away from the body electrode 144. According to this embodiment, the source electrodes 146 are electrodes formed by stacking a layer mainly made of aluminum (Al) on a layer mainly made of titanium (Ti) and processing the stacked layers by heat treatment.

The drain electrode 148 of the semiconductor device 100 is an electrode that is arranged to be in ohmic contact with a −Z-axis direction-side rear face of the substrate 110. According to this embodiment, the drain electrode 148 is an electrode formed by stacking a layer mainly made of aluminum (Al) on a layer mainly made of titanium (Ti) and processing the stacked layers by heat treatment.

A-2. Method of Manufacturing Semiconductor Device

FIG. 2 is a process chart showing a method of manufacturing the semiconductor device 100 according to the first embodiment. The manufacturer first forms the n-type semiconductor layer 112 on the substrate 110 by crystal growth (process P110). According to this embodiment, the manufacturer forms the n-type semiconductor layer 112 on a +Z-axis direction-side surface of the substrate 110. According to this embodiment, the manufacture forms the n-type semiconductor layer 112 by metal organic chemical vapor deposition (MOCVD). According to this embodiment, the n-type semiconductor layer 112 is mainly made of gallium nitride (GaN).

After forming the n-type semiconductor layer 112 (process P110), the manufacturer forms the p-type semiconductor regions 113 in part of the n-type semiconductor layer 112 by ion implantation (process P120). According to this embodiment, the manufacturer forms the p-type semiconductor regions 113 in partial areas on the +Z-axis direction side of the n-type semiconductor layer 112.

After forming the p-type semiconductor regions 113 (process P120), the manufacturer forms the p-type semiconductor layer 114 on the surface of the n-type semiconductor layer 112 and the p-type semiconductor regions 113 (process P130). According to this embodiment, the manufacturer forms the p-type semiconductor layer 114 mainly from gallium nitride (GaN) by metal organic chemical vapor deposition (MOCVD).

After forming the p-type semiconductor layer 114 (process P130), the manufacturer forms the n-type semiconductor layer 116 on the p-type semiconductor layer 114 (process P140). According to this embodiment, the manufacturer forms the n-type semiconductor layer 116 by metal organic chemical vapor deposition (MOCVD).

After forming the n-type semiconductor layer 116 (process P140), the manufacturer forms the trench 122 and the recesses 124 by etching (process P150). According to this embodiment, the manufacturer forms the trench 122 and the recesses 124 by dry etching.

After forming the trench 122 and the recesses 124 (process P150), the manufacturer forms an insulating film (process P160). According to this embodiment, the manufacturer forms the insulating film 130 on exposed faces of the n-type semiconductor layer 112 that are exposed by formation of the trench 122 and on a partial area of the +Z-axis direction side of the semiconductor layer 116. In the process of forming the insulating film 130 (process P160), the insulating film 130 is also formed on exposed side faces of the p-type semiconductor layer 114 and the n-type semiconductor layer 116 that are exposed by formation of the trench 122.

FIG. 3 is a process chart showing the details of the process of forming the insulating film 130 (process P160) according to the first embodiment. In the process of forming the insulating film 130 (process P160), the manufacturer first forms the insulating film 130 by using a nitrogen (N)-containing organic metal as the raw material on the semiconductor layers 112 and 116 by atomic layer deposition (ALD) (process P161). The process P161 is also called first process. The thickness (length in the Z-axis direction) of the insulating film 130 is not less than 50 nm and not greater than 200 nm and may be, for example, 100 nm according to this embodiment.

In the description hereof, the nitrogen (N)-containing organic metal denotes a compound having a bonding of a metal and an amino group. Examples of the nitrogen (N)-containing organic metal include SAM.24 (registered trademark), bis(tert-butylamino)silane (BTBAS) and tris(dimethylamino)silane (TDMAS).

After forming the insulating film 130 (process P161), the manufacturer treats the insulating film 131 by oxygen plasma treatment in an atmosphere including at least one of oxygen ($O_2$) and ozone ($O_3$) (process P163). The process P163 is also called second process. The oxygen plasma treatment is performed not for the purpose of forming the shape of the insulating film 130 but for the purpose of controlling the nitrogen (N) concentration in the insulating film 130. The oxygen plasma treatment is accordingly different from dry etching.

According to this embodiment, the oxygen plasma treatment is performed in an atmosphere including oxygen ($O_2$). For example, a method using a direct plasma or a method using a remote plasma may be employed for the oxygen plasma treatment. In terms of reducing the potential damage of the insulating film 130 and the semiconductor layers 112, 114 and 116 by plasma, it is preferable to use a remote plasma for the oxygen plasma treatment. In terms of further reducing the potential damage of the insulating film 130 and the semiconductor layers 112, 114 and 116 by plasma, it is preferable to use an electron cyclotron resonance (ECR) plasma for the oxygen plasma treatment.

The second process of this embodiment (process P163) may use ECR plasma with a microwave excitation power of 500 W and an oxygen flow rate of 20 sccm. The second process (process P163) is performed preferably in a reduced-pressure atmosphere. The pressure in the second process (process P163) is not greater than $5.0 \times 10^{-2}$ Pa according to this embodiment. The second process (process P163) enables nitrogen (N) and hydrogen (H) included in the insulating film 130 to be released from the insulating film 130 and thereby controls the nitrogen (N) concentration and the hydrogen (H) concentration in the insulating film 130. A bias power is not applied to draw ions into the substrate 110 according to this embodiment but may be applied as long as the damage of the insulating film 130 and the semiconductor layers 112, 114 and 116 by plasma is within an allowable range.

In the second process (process P163), the insulating film 130 may be at room temperature or may be heated. The insulating film 130 may be heated by heating a stage on which an intermediate product of the semiconductor device 100 including the insulating film 130 is placed. In terms of efficiently releasing hydrogen (H) and nitrogen (N) included in the insulating film 130, the temperature of the insulating film 130 in the second process (process P163) is preferably not lower than 300° C. and is more preferably not lower than 400° C. and is also preferably not higher than 500° C. According to this embodiment, the second process (process P163) is performed for 60 minutes in the state that the temperature of the substrate 110 that is indirectly in contact with the insulating film 130 reaches 300° C.

After performing the second process (process P163), the manufacturer processes the insulating film 130 by heat treatment in a nitrogen (N)-containing atmosphere (process P165). The process P165 is also called third process. The temperature of heat treatment is preferably not lower than 400° C. and is also preferably not higher than 500° C. and may be, for example, 500° C. according to this embodiment. The third process (process P165) recovers the damage of the insulating film 130 and the semiconductor layers 112, 114 and 116 in the second process (process P163) and stabilizes the electrical properties of the insulating film 130. After the third process (process P165), the process of forming the insulating film 130 (process P160) is terminated.

FIG. 4 is a sectional view schematically illustrating concentration distributions in the insulating film 130 after the process of forming the insulating film 130 (process P160). An area R shown in FIG. 4 corresponds to an area R shown in FIG. 1.

A region 132 of the insulating film 130 to a depth (in the Z-axis direction) of 30 nm from a face S1 (+Z-axis direction side face) of the insulating film 130 that is not adjacent to and not in contact with the n-type semiconductor layer 116 is a region of low nitrogen (N) concentration. This region 132 is thus also called low nitrogen concentration region 132. The average nitrogen (N) concentration in the low nitrogen concentration region 132 is lower than $3.0 \times 10^{18}$ cm$^{-3}$ and may be, for example, about $2.1 \times 10^{18}$ cm$^{-3}$ according to this embodiment. The low nitrogen (N) concentration in the region 132 may be attributed to the release of nitrogen (N) included in the insulating film 130 from the insulating film 130 by the second process (process P163) and the third process (process p165).

In terms of reducing a CV hysteresis of the insulating film 130, the average hydrogen (H) concentration in a region of the insulating film 130 to a depth (in the Z-axis direction) of 20 nm from the face S1 (+Z-axis direction side face) of the insulating film 130 that is not adjacent to and not in contact with the n-type semiconductor layer 116 is preferably lower than $10^{21}$ cm$^{-3}$ and is also preferably not lower than $1.0 \times 10^{20}$ cm$^{-3}$. The low hydrogen (H) concentration in this region may be attributed to the release of hydrogen (H) included in the insulating film 130 from the insulating film 130 by the second process (process P163) and the third process (process p165), similarly to the reason for the low nitrogen (N) concentration in the region 132.

The average nitrogen (N) concentration in a region 134 of the insulating film 130 from a virtual plane S2 that is at a depth of 30 nm from the face S1 (+Z-axis direction side face) of the insulating film 130 that is not adjacent to and not in contact with the n-type semiconductor layer 116 to a virtual plane S3 that is at a depth of 20 nm to a face S4 of the insulating film 130 that is adjacent to and is in contact with the n-type semiconductor layer 116 is not lower than $3.0 \times 10^{18}$ cm$^{-3}$ and is also lower than $1.0 \times 10^{19}$ cm$^{-3}$ and may be, for example, about $5.7 \times 10^{18}$ cm$^{-3}$ according to this embodiment. The region 134 is also called inner film region 134.

A region 136 of the insulating film 130 from the virtual plane S3 to the face S4 is a region of high nitrogen (N) concentration. This region 136 is thus also called high nitrogen concentration region 136. The high nitrogen (N) concentration in the region 136 may be attributed to transfer of part of nitrogen (N) included in the inner film region 134 to the n-type semiconductor layer 116 by the second process (process P163) and the third process (process P165).

After forming the insulating film 130 (process P160 shown in FIG. 2), the manufacturer forms the gate electrode 142, the body electrodes 144, the source electrodes 146 and the drain electrode 148 (process P170). The sputtering method and the vapor deposition method may be employed according to this embodiment. The semiconductor device 100 is completed by the series of processes described above.

A-3. Advantageous Effects

The manufacturing method of the first embodiment described above forms the insulating film 130 in the first process (process P161), subsequently performs the oxygen plasma treatment in the second process (process P163) and processes the insulating film 130 by heat treatment in the nitrogen (N)-containing atmosphere in the third process (process P165). This configuration provides a favorable distribution of nitrogen (N) concentration in the insulating film 130. As a result, the manufacturing method of the first embodiment reduces a CV hysteresis of the insulating film 130 and thereby enables the semiconductor device 100 of the stable operation to be manufactured. The following describes the results of an evaluation test supporting that the CV hysteresis of the insulating film 130 is reduced by performing the second process (process P163) and the third process (process P165) after formation of the insulating film 130 in the first process (process P161).

A-4. Results of Test

FIGS. 5 to 10 are diagrams showing the results of an evaluation test. Samples 1 to 3 described below were used in the evaluation test. More specifically, the examiner first formed the insulating film 130 on the n-type semiconductor layer 116. The thickness of the insulating film 130 was 100 nm. The examiner subsequently processed the insulating films 130 of the sample 1 and the sample 2 by oxygen plasma treatment. More specifically, in the same manner as that described in the above embodiment, the examiner plasma-treated the insulating film 130 of the sample 1 that was heated to 300° C. (process P163). The examiner also plasma-treated the insulating film 130 of the sample 2 at room temperature (process P163). The sample 3 was Comparative Example, while the sample 1 and the sample 2 were Examples according to the embodiment of the present disclosure. The examiner accordingly did not plasma-treat the insulating film 130 of the sample 3 (process P163). The examiner then performed heat treatment (process P165) with respect all the samples 1 to 3.

Figure 5:
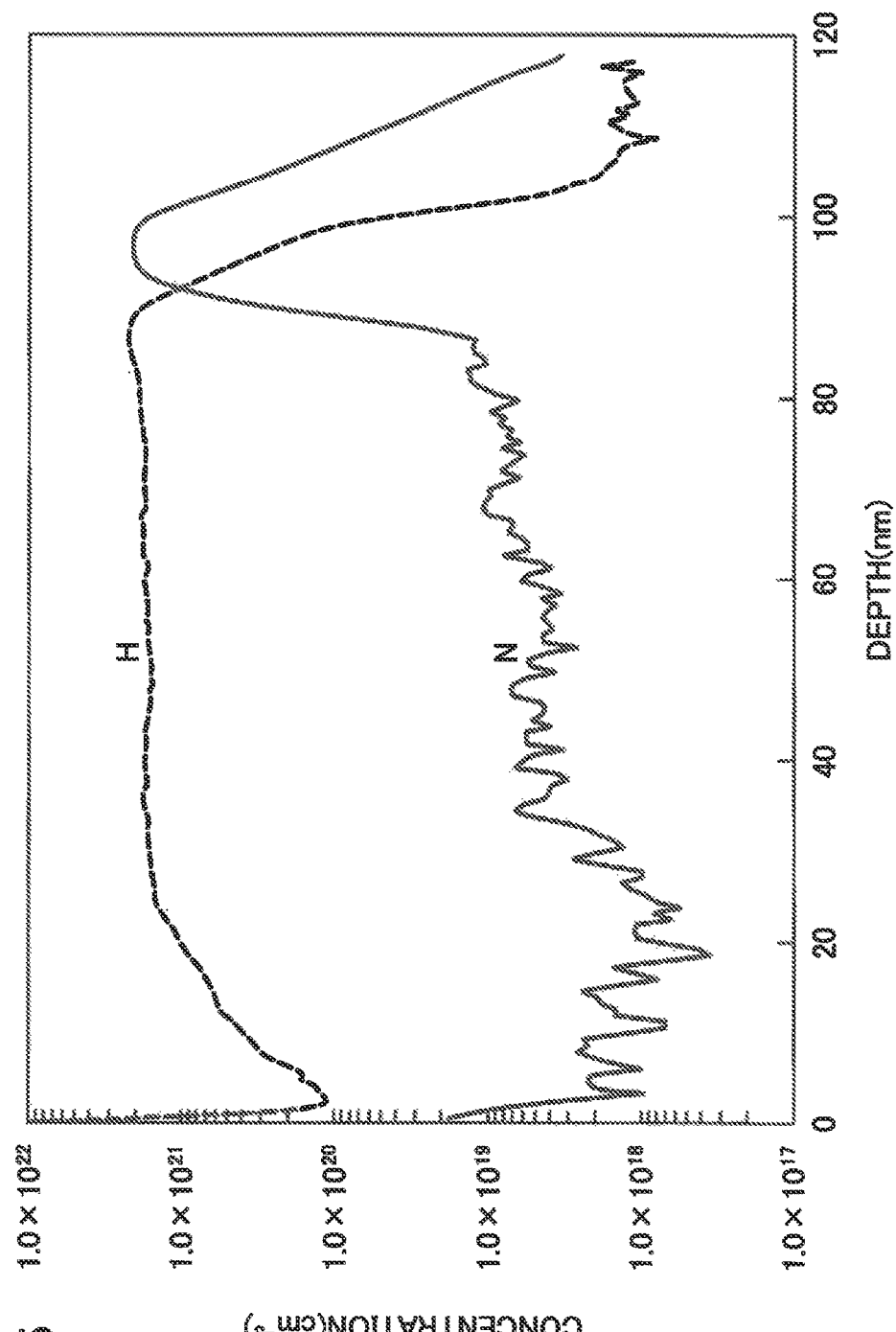
FIG. 5 is a diagram showing the results of an evaluation test.
Figure 6:
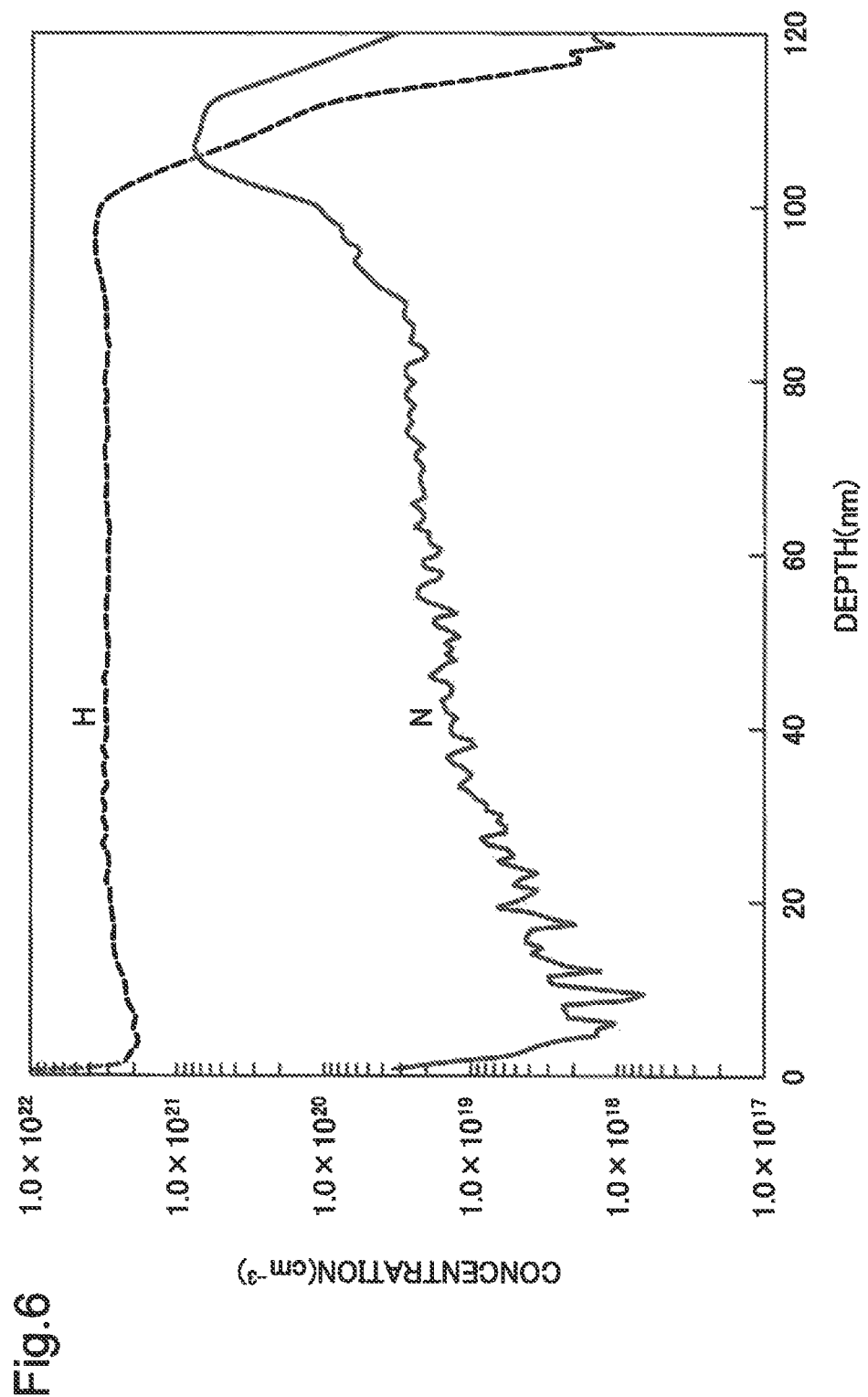
FIG. 6 is a diagram showing the results of the evaluation test.
Figure 8:
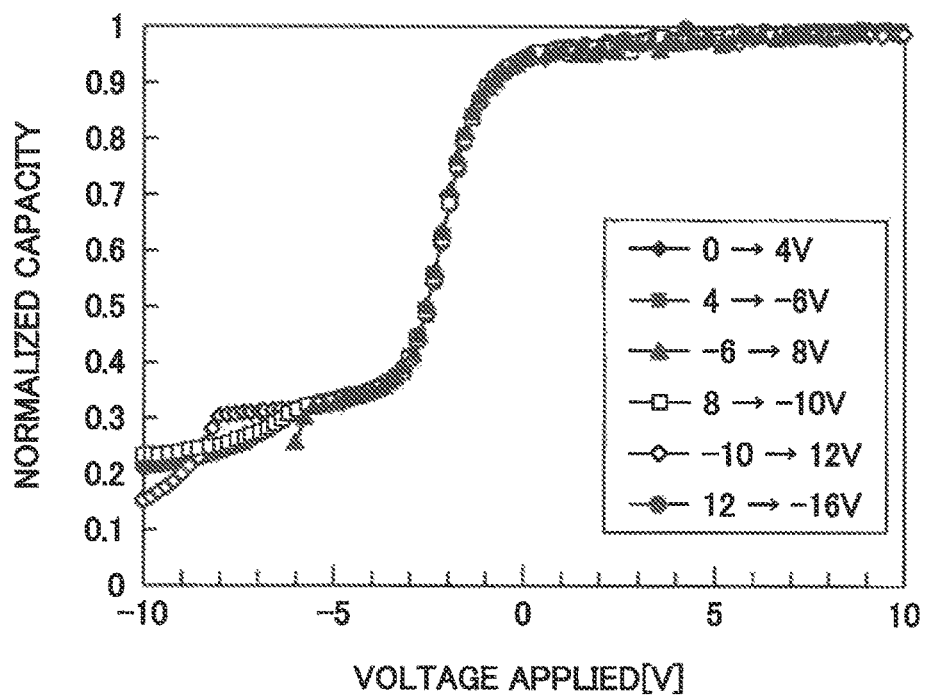
FIG. 8 is a diagram showing the results of the evaluation test.
Figure 9:
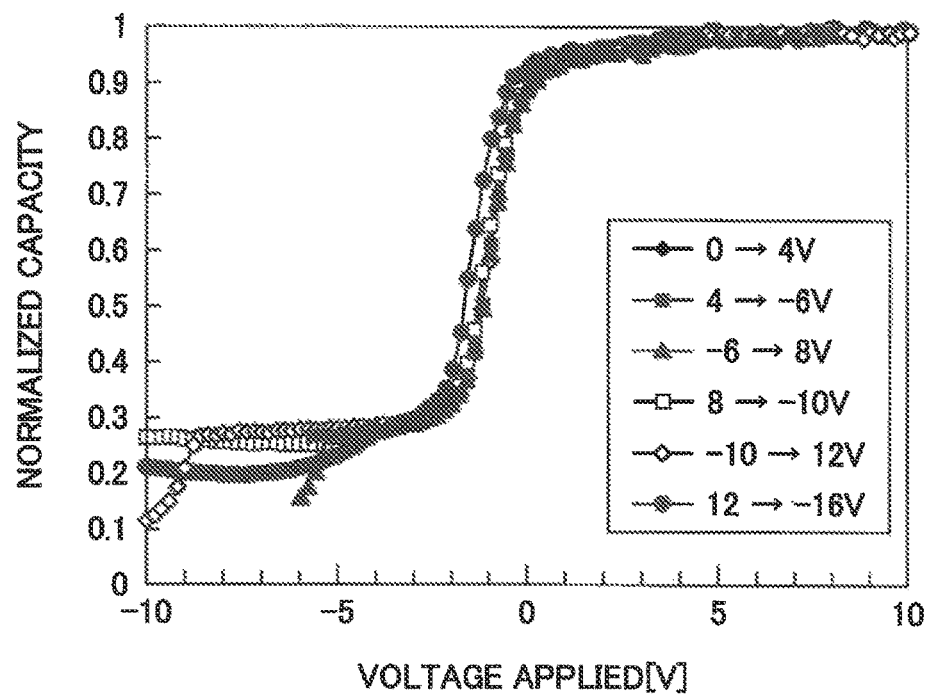
FIG. 9 is a diagram showing the results of the evaluation test.

The test results of the sample 1 with the plasma treatment in the heated condition of 300° C. (process P163) are shown in FIG. 5 and FIG. 8. The test results of the sample 2 with the plasma treatment at room temperature (process P163) are shown in FIG. 6 and FIG. 9. The test results of the sample 3 without the plasma treatment (process P163) are shown in FIG. 7 and FIG. 10.

Figure 7:
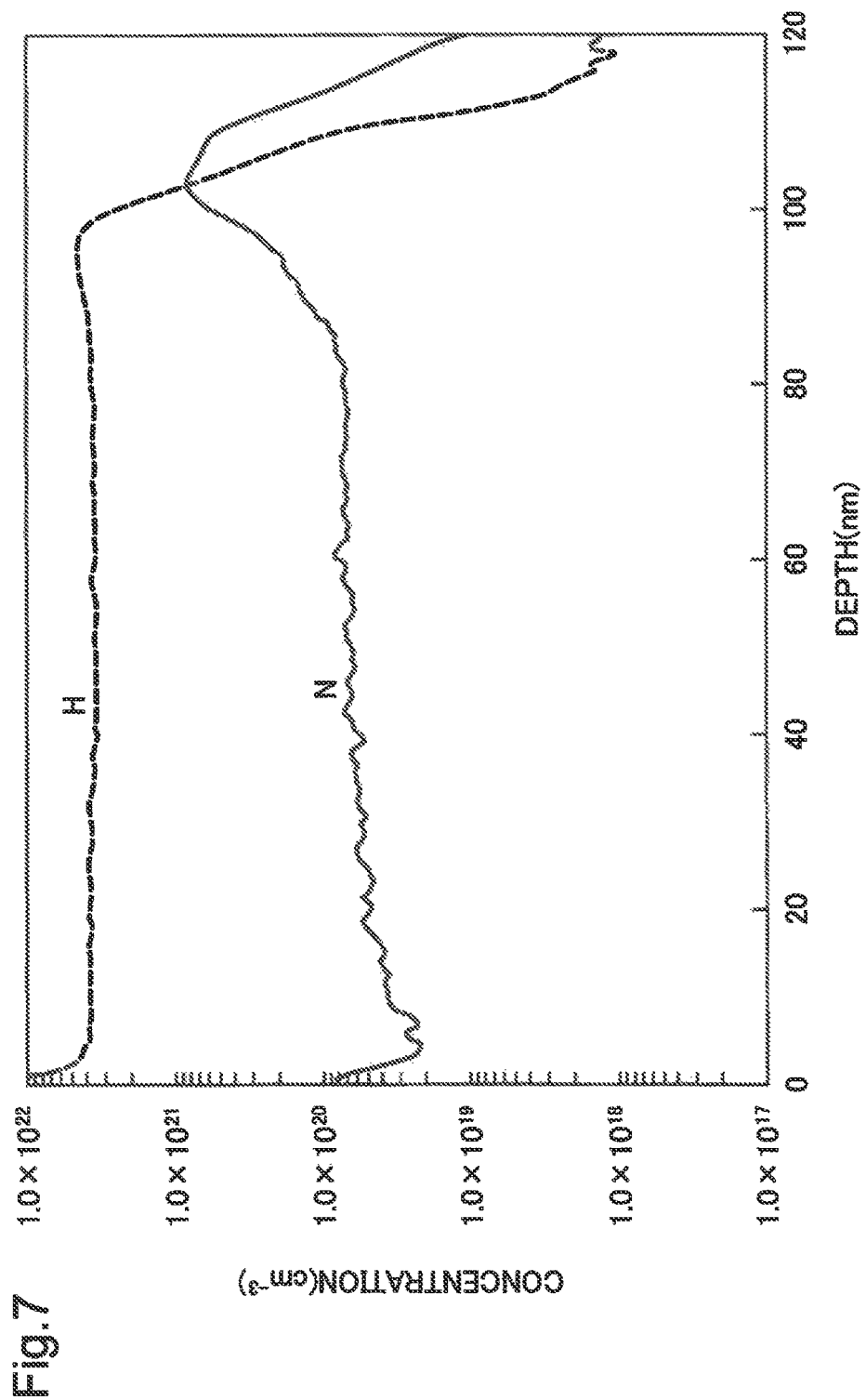
FIG. 7 is a diagram showing the results of the evaluation test.

FIGS. 5 to 7 show the results of measurement of the nitrogen (N) concentration and the hydrogen (H) concentration in the insulating films 130 of the respective samples 1 to 3 by secondary ion mass spectrometry (SIMS). In FIGS. 5 to 7, the abscissa axis shows the depth (nm) in the −Z-axis direction of the insulating film 130, and the ordinate axis shows the nitrogen (N) concentration and the hydrogen (H) concentration ($cm^{-3}$). The depth of 0 nm indicates a +Z-axis direction-side surface of the insulating film 130.

Figure 10:
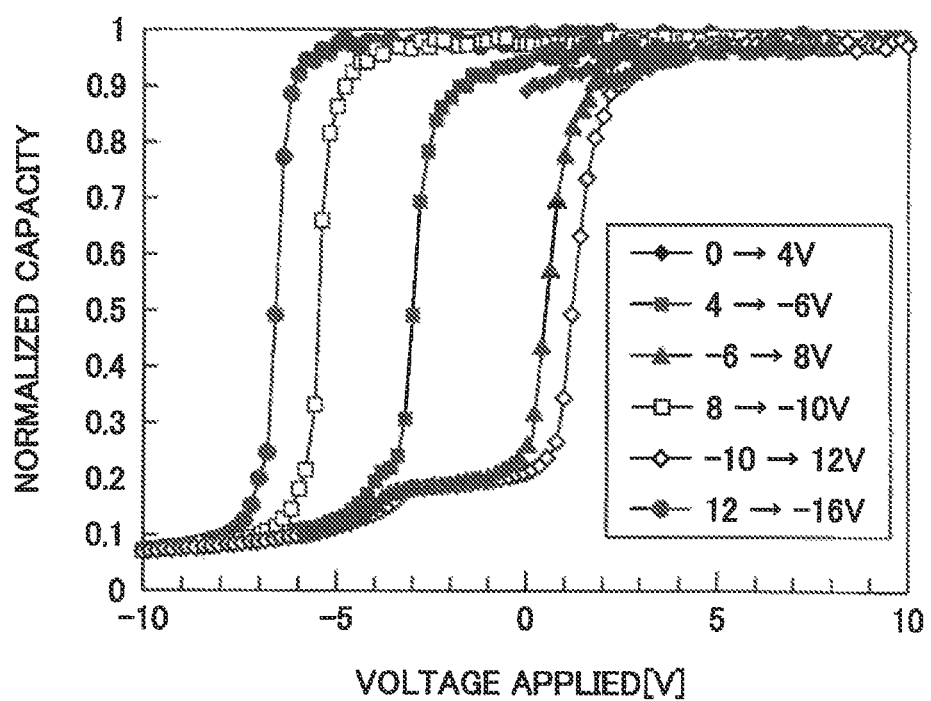
FIG. 10 is a diagram showing the results of the evaluation test.

FIGS. 8 to 10 show the results of measurement of the CV hysteresis characteristic of the insulating film 130. These measurement results were obtained by applying a voltage to a surface (+Z-axis direction side face) of the insulating film 130 and a rear face (−Z-axis direction side face) of the n-type semiconductor layer 116. In FIGS. 8 to 10, the abscissa axis shows the voltage applied, and the ordinate axis shows the capacity normalized by the insulating film capacity (Ci). This measurement was performed under the following conditions:

frequency: 100 kHz;
voltage sweep direction: 0V→+4 V→−6 V→+8 V→−10 V→+12 V→−16V
sweep step: 0.2 V/step
temperature in measurement: room temperature (25° C.)
measurement environment: light shielding environment The results of FIGS. 5 to 7 show the following. The nitrogen (N) concentration is lower in the region at the depth of 0 nm to 30 nm in the results of the samples 1 and 2 (Examples) with the plasma treatment (process P163) (shown in FIGS. 5 and 6), compared with in the result of the sample 3 (Comparative Example) without the plasma treatment (process P163) (shown in FIG. 7). More specifically, the average nitrogen concentration of the sample 3 (Comparative Example) in this region (shown in FIG. 7) is not lower than $3.0 \times 10^{18}$ $cm^{-3}$ and is more specifically about $3.0 \times 10^{19}$ $cm^{-3}$. The average nitrogen concentrations of the sample 1 and the sample 2 (Examples) in this region (shown in FIG. 5 and FIG. 6) are, on the other hand, not higher than $3.0 \times 10^{18}$ $cm^{-3}$. These results show that nitrogen (N) in the vicinity of the surface of the insulating film 130 is released by the plasma treatment (process P163).

Similarly, the results of FIGS. 5 to 7 show the following. The hydrogen (H) concentration is lower in the region at the depth of 0 nm to 20 nm in the results of the samples 1 and 2 (Examples) with the plasma treatment (process P163) (shown in FIGS. 5 and 6), compared with in the result of the sample 3 (Comparative Example) without the plasma treatment (process P163) (shown in FIG. 7). More specifically, the average hydrogen concentration of the sample 3 (Comparative Example) in this region (shown in FIG. 7) is higher than $1.0 \times 10^{21}$ $cm^{-3}$. The average hydrogen concentrations of the sample 1 and the sample 2 (Examples) in this region (shown in FIG. 5 and FIG. 6) are, on the other hand, not higher than $1.0 \times 10^{21}$ $cm^{-3}$. These results show that hydrogen (H) in the vicinity of the surface of the insulating film 130 is released by the plasma treatment (process P163). The high nitrogen concentration and the high hydrogen concentration at the depth of 0 nm to several nm in the results of FIGS. 5 to 7 may be attributed to the effect of noise due to the deposits on the surface of the insulating film 130.

The results of FIGS. 8 to 10 show the following. The closed areas by one hysteresis loop in the results of the samples 1 and 2 (Examples) with the plasma treatment (process P163) (shown in FIGS. 8 and 9) are smaller than the closed area in the result of the sample 3 (Comparative Example) without the plasma treatment (process P163) (shown in FIG. 10). These results show that the CV hysteresis is reduced in the samples 1 and 2 (Examples) with the plasma treatment (process P163), compared with the sample 3 (Comparative Example) without the plasma treatment (process P163).

The closed area by one hysteresis loop in the test result of the sample 1 with the plasma treatment (process P163) in the heated condition of the insulating film 130 (shown in FIG. 8) is further smaller than the closed area in the test result of the sample 2 with the plasma treatment (process P163) at room temperature (shown in FIG. 9). These results show that the CV hysteresis is further reduced by the plasma treatment (process P163) in the heated condition of the insulating film 130, compared with the plasma treatment (process P163) at room temperature.

B. Other Embodiments

The disclosure is not limited to any of the embodiment, the examples and the modifications described above but may be implemented by a diversity of other configurations without departing from the scope of the disclosure. For example, the technical features of any of the embodiment, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

According to the embodiment described above, gallium nitride is used as the semiconductor. The present disclosure is, however, not limited to this embodiment. For example, silicon (Si), sapphire ($Al_2O_3$) or silicon carbide (SiC) may be used as the semiconductor.

The semiconductor device to which the present disclosure is applied is not limited to the vertical trench MOSFET described in the above embodiment but may be, for example, a vertical Schottky barrier diode, an insulated gate bipolar transistor (IGBT) or an MESFET (metal-semiconductor field effect transistor). The configuration of the semiconductor device of the present disclosure may be applied to any semiconductor device including an insulating film on a semiconductor layer. The manufacturing method of the present disclosure may be applied to any manufacturing method that includes a process of forming an insulating film on a semiconductor layer.

In the embodiment described above, the materials used for the respective electrodes are not limited to the materials described in the above embodiment but may be other materials.

The invention claimed is:

1. A method of manufacturing a semiconductor device, the method comprising:
    forming an insulating film from a nitrogen-containing organic metal used as a raw material, on a semiconductor layer by an atomic layer deposition;
    processing the insulating film by an oxygen plasma treatment in an atmosphere including at least one of oxygen and ozone; and
    processing the insulating film by a heat treatment in a nitrogen-containing atmosphere, after the processing of the insulating film by the oxygen plasma treatment,
    wherein the oxygen plasma treatment and the heat treatment are conducted to release nitrogen from the insulating film such that an average nitrogen concentration in a region of the insulating film to a depth of 30 nm from a face of the insulating film that is not adjacent to and not in contact with the semiconductor layer is lower than $3.0 \times 10^{18}$ cm$^{-3}$, and the average nitrogen concentration in a region of the insulating film from a virtual plane that is at the depth of 30 nm from the face of the insulating film that is not adjacent to and not in contact with the semiconductor layer to a virtual plane that is at a depth of 20 nm to the face of the insulating film that is adjacent to and in contact with the semiconductor layer is in a range from $3.0 \times 10^{18}$ cm$^{-3}$ to $1.0 \times 10^{19}$ cm$^{-3}$.

2. The method of manufacturing the semiconductor device according to claim 1, wherein a remote plasma is used for the oxygen plasma treatment.

3. The method of manufacturing the semiconductor device according to claim 2, wherein an electron cyclotron resonance plasma is used for the oxygen plasma treatment.

4. A semiconductor device comprising a semiconductor layer and an insulating film that is arranged to be adjacent to and in contact with the semiconductor layer,
    wherein an average nitrogen concentration in a region of the insulating film to a depth of 30 μm from a face of the insulating film that is not adjacent to and not in contact with the semiconductor layer is lower than $3.0 \times 10^{18}$ cm$^{-3}$, and
    the average nitrogen concentration in a region of the insulating film from a virtual plane that is at a depth of 30 nm from the face of the insulating film that is not adjacent to and not in contact with the semiconductor layer to a virtual plane that is at a depth of 20 nm to a face of the insulating film that is adjacent to and in contact with the semiconductor layer is not lower than $3.0 \times 10^{18}$ cm$^{-3}$ and is lower than $1.0 \times 10^{19}$ cm$^{-3}$.

5. The semiconductor device according to claim 4, wherein an average hydrogen concentration in a region of the insulating film to a depth of 20 nm from the face of the insulating film that is not adjacent to and not in contact with the semiconductor layer is not lower than $1.0 \times 10^{20}$ cm$^{-3}$ and is lower than $10^{21}$ cm$^{-3}$.

6. The semiconductor device according to claim 4, further comprising:
    an electrode formed from a metal, on the insulating film.

7. The semiconductor device according to claim 6, wherein the semiconductor layer includes a groove, and the insulating film is formed inside of the groove.

8. The semiconductor device according to claim 7, the semiconductor device being a vertical trench MOSFET.

9. The method of manufacturing the semiconductor device according to claim 1, wherein the semiconductor layer comprises an n-type semiconductor layer on a surface of which the insulating film is disposed.

10. The method of manufacturing the semiconductor device according to claim 9, wherein the semiconductor layer further comprises a p-type semiconductor layer on a surface of which the insulating film is disposed.

11. The method of manufacturing the semiconductor device according to claim 10, wherein the semiconductor layer further comprises another n-type semiconductor layer on a surface of which the insulating film is disposed.

12. The method of manufacturing the semiconductor device according to claim 11, further comprising a p-type region disposed away from the insulating film at a boundary of the p-type semiconductor layer and said another n-type semiconductor layer.

13. The method of manufacturing the semiconductor device according to claim 11, wherein a bottom surface of the insulating film is disposed between a bottom surface of said another n-type semiconductor layer and a top surface of said another n-type semiconductor layer.

14. The method of manufacturing the semiconductor device according to claim 1, further comprising:
    forming a groove inside the semiconductor layer, the insulating film being disposed on a bottom surface of the groove.

15. The method of manufacturing the semiconductor device according to claim 14, wherein the insulating film is disposed on an entirety of the bottom surface of the groove.

16. The method of manufacturing the semiconductor device according to claim 1, wherein the heat treatment is performed at a temperature in a range from 400° C. to 500° C.

17. The method of manufacturing the semiconductor device according to claim 1, wherein the oxygen plasma treatment and the heat treatment are conducted to release hydrogen from the insulating film such that an average hydrogen concentration in the region of the insulating film to the depth of 20 nm from the face of the insulating film that is not adjacent to and not in contact with the semiconductor layer is in a range from $1.0 \times 10^{20}$ cm$^{-3}$ to $10^{21}$ cm$^{-3}$.

18. A method of manufacturing a semiconductor device, the method comprising:

forming an insulating film from a nitrogen-containing organic metal on a semiconductor layer by an atomic layer deposition;

processing the insulating film by an oxygen plasma treatment; and processing the insulating film by a heat treatment in a nitrogen-containing atmosphere, after the processing of the insulating film by the oxygen plasma treatment, wherein the oxygen plasma treatment and the heat treatment are conducted to release hydrogen from the insulating film such that an average hydrogen concentration in a region of the insulating film to a depth of 20 nm from a face of the insulating film that is not adjacent to and not in contact with the semiconductor layer is in a range from $1.0 \times 10^{20}$ cm$^{-3}$ to $10^{21}$ cm$^{-3}$.

19. The method of manufacturing the semiconductor device according to claim 18, wherein the oxygen plasma treatment and the heat treatment are conducted to release nitrogen from the insulating film such that an average nitrogen concentration in the region of the insulating film to a depth of 30 nm from the face of the insulating film that is not adjacent to and not in contact with the semiconductor layer is lower than $3.0 \times 10^{18}$ cm$^{-3}$.

20. The method of manufacturing the semiconductor device according to claim 19, wherein the average nitrogen concentration in the region of the insulating film from a virtual plane that is at the depth of 30 nm from the face of the insulating film that is not adjacent to and not in contact with the semiconductor layer to a virtual plane that is at the depth of 20 nm to the face of the insulating film that is adjacent to and in contact with the semiconductor layer is in a range from $3.0 \times 10^{18}$ cm$^{-3}$ to $1.0 \times 10^{19}$ cm$^{-3}$.

* * * * *